United States Patent [19]

Daniels et al.

[11] Patent Number: 5,142,442
[45] Date of Patent: Aug. 25, 1992

[54] COMBINED FAN SPACER AND WIRE GUIDE

[75] Inventors: George R. Daniels, Houston; Thomas T. Hardt, Missouri City, both of Tex.

[73] Assignee: Compaq Computer Corporation, Houston, Tex.

[21] Appl. No.: 612,131

[22] Filed: Nov. 13, 1990

[51] Int. Cl.⁵ .............................................. H05K 7/20
[52] U.S. Cl. ..................................... 361/384; 361/390
[58] Field of Search ...................... 98/1; 361/340, 380, 361/383, 384, 390, 391, 395, 428; 174/16.1, 68.3, 101; 364/708

[56] References Cited

U.S. PATENT DOCUMENTS

| 4,710,851 | 12/1987 | Pastecki | 361/384 |
| 4,751,872 | 6/1988 | Lawson, Jr. | 361/384 |
| 4,956,531 | 9/1990 | Braunisch et al. | 361/384 |

OTHER PUBLICATIONS

Compaq Computer Corporation Brochure for Compaq SystemPro, Nov. 1989.

Primary Examiner—Gregory D. Thompson
Attorney, Agent, or Firm—Pravel, Gambrell, Hewitt, Kimball & Krieger

[57] ABSTRACT

A combined fan clearance and wire guide device for use with electronic equipment. A surface generally parallel to the rear of the computer system unit is extended from the rear of the system unit the distance necessary to provide adequate clearance for proper air flow developed by fans contained in the system unit. Arms are provided which are angled from this clearance surface and a distance from side portions of the system unit to form cavities for guiding wires and cables.

12 Claims, 4 Drawing Sheets

COMBINED FAN SPACER AND WIRE GUIDE

BACKGROUND OF THE INVENTION

1. Field of the Invention

The invention generally relates to housings used with computer systems and more particularly to a means for routing cables and for providing adequate fan clearance.

2. Description of the Related Art

Personal computers and the modules associated with them are becoming more complex. As this complexity increases, more components are placed in the computer systems. As more of these components, either electronics or peripheral devices such as disk drives, are placed inside the computer system, more and more heat is generated. Further, cabling is usually necessary between the devices and external devices, and this cabling can be quite burdensome in complex systems. With the advent of the increased heat being developed, multiple fans are being installed in the personal computer systems to move cooling air through the unit. The computer systems are additionally becoming less tolerant to overheating conditions, particularly if expensive disk drive units are installed. If the computer system with a fan is located such that the fan is too close to a wall or other vertical surface and adequate ventilation clearances are not provided, the probability of the computer system overheating and causing damage to the electronics and/or disk drive or peripheral units is greatly increased. Because of the great expense of the units, and the downtime associated with any failures, it is desirable that the system is always placed a minimum distance from vertical surfaces so that fan clearances are always provided. Further, it is desirable to have assistance in cable and wire routing to help manage the large number of cables often present.

SUMMARY OF THE INVENTION

A computer system according to the present invention uses a combined wire guide and fan clearance device. The fans are mounted on the back of the computer system unit and require certain clearances between the back of the computer system unit and a vertical surface, such as a wall or the back of a desk, to provide adequate ventilation clearance for the fans to have the designed air flow characteristics. A surface extended from the back of the computer system unit is provided so that the computer system unit can not be moved closer to the vertical surface than the surface. The distance the surface extends beyond the back of the computer system unit is sufficient to allow positive fan clearance as desired.

Further, the extended surface is preferably configured to provide positive cable retaining to assist in the routing of wires and cable at the back of the system unit. Thus, the extended surface forms a device for providing fan clearance and wire and cable guidance.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
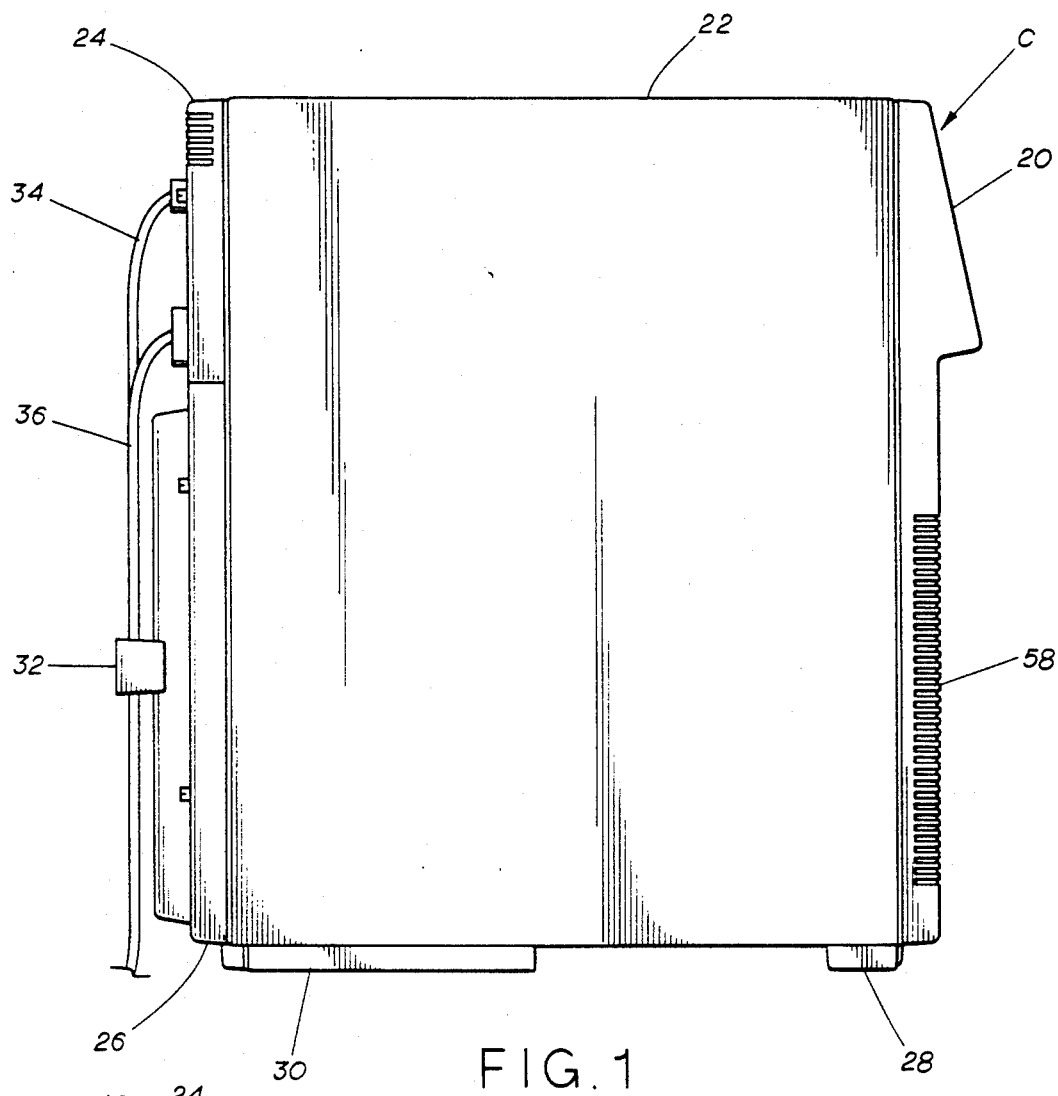
FIG. 1 is a side view of a computer system unit according to the present invention, including the combined wire guide and fan clearance device.

Referring now to FIG. 1, the letter C generally represents a computer system unit incorporating the present invention. The housing of the computer system unit C generally comprises four elements, a front bezel 20, a center U-shaped portion or main section 22, an upper rear bezel portion 24 and a lower rear bezel portion 26. Additionally the computer system C includes a front foot 28 and a rear foot arrangement 30. Attached to the lower rear bezel 26 is the combined wire routing and fan clearance device 32 according to the present invention. Cables 34 and 36 are connected to elements in the computer system unit C and are routed down the back of the computer system unit C and through the combined device 32 to their ultimate destination.

Figure 2:
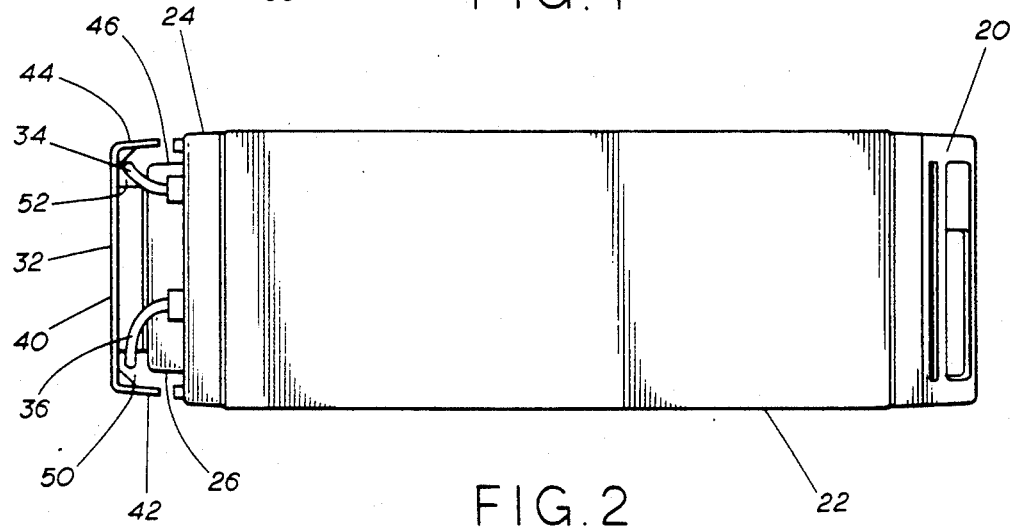
FIG. 2 is a top view of the computer system unit of FIG 1.

As can be seen in the top view of FIG. 2, the combined device 32 has a rear flat portion 40 and two angled arms 42 and 44 preferably located at the ends of the rear portion 40. The rear flat portion 40 is generally parallel to the rear of the computer system unit C and is provided a desired distance away from the back surface of the bottom rear bezel 26. As can be seen in FIG. 2 the bottom rear bezel 26 includes a module 46 extending from the general line of the rear of the computer system unit C, this module 46 being slightly narrower then the computer system unit C. The width of the rear portion 40 of the combined device 32 is such that the arms 42 and 44 are within the width of the computer system unit C and yet are separated by a distance greater than the width of the module 46. Preferably the arms 42 and 44 are longer than the distance of the rear portion 40 from the back of the bottom rear bezel 26. Because of the extension of the rear portion 40 from the rear of the module 46 and the side clearances just described, cavities 50 and 52 are provided for the routing and guiding of cables 34 and 36 as desired. The arms 42 and 44 could be located at positions from the ends of the rear portion 40 or the rear portion 40 could be of a width such that the arms 42 and 44 are provided beyond the width of the computer system unit C, so long as cavities 50 and 52 are developed to provide wire routing and guiding capabilities.

Figures 3, 4:
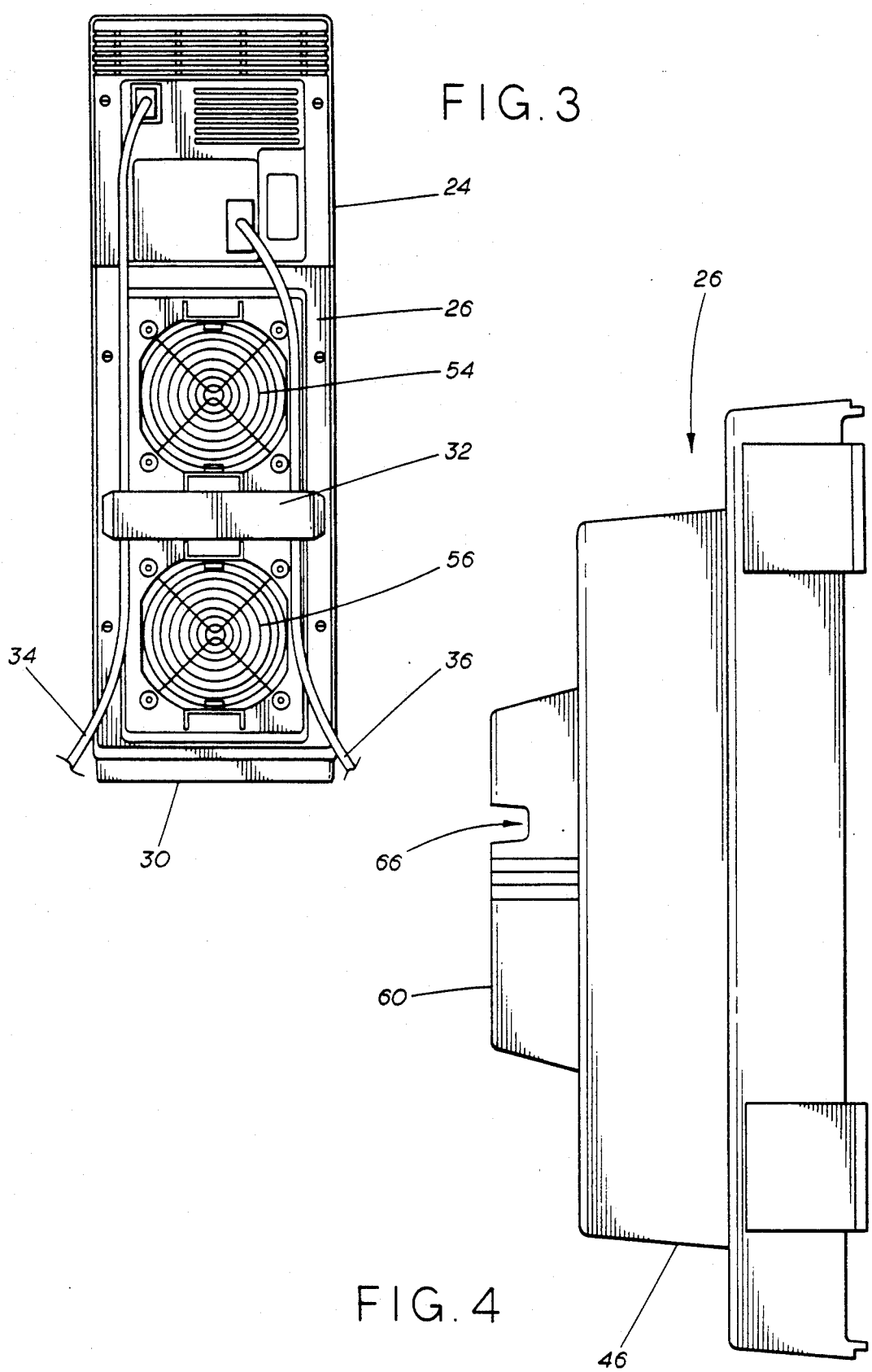
FIG. 3 is a rear view of the computer system unit of FIG. 1.
FIG. 4 is a bottom view of the lower rear bezel of the system unit of FIG. 1.

Referring now to FIG. 3, a rear view of the computer system unit C, two fans 54 and 56 are readily discernable. The fans 54 and 56 are used to provide air flow circulation through the computer system unit C and the disk drive bay area in the preferred embodiment. Air is provided through openings in a grill area 58 of the front bezel 20, through the central portion of the computer system unit C and out through the fans 54 and 56. If the fans 54 and 56 are located too close to a vertical surface, then the fans 54 and 56 cannot properly exhaust air and the temperature may rise in the computer system unit C due to a lack of proper cooling. The distance from the rear portion 40 of the combined device 32 to the back of the fans 54 and 56 which are located in the module 46 of the lower rear bezel 26 is such that adequate clearance is provided to allow sufficient air flow to meet design requirements for the computer system unit C.

Figure 5:
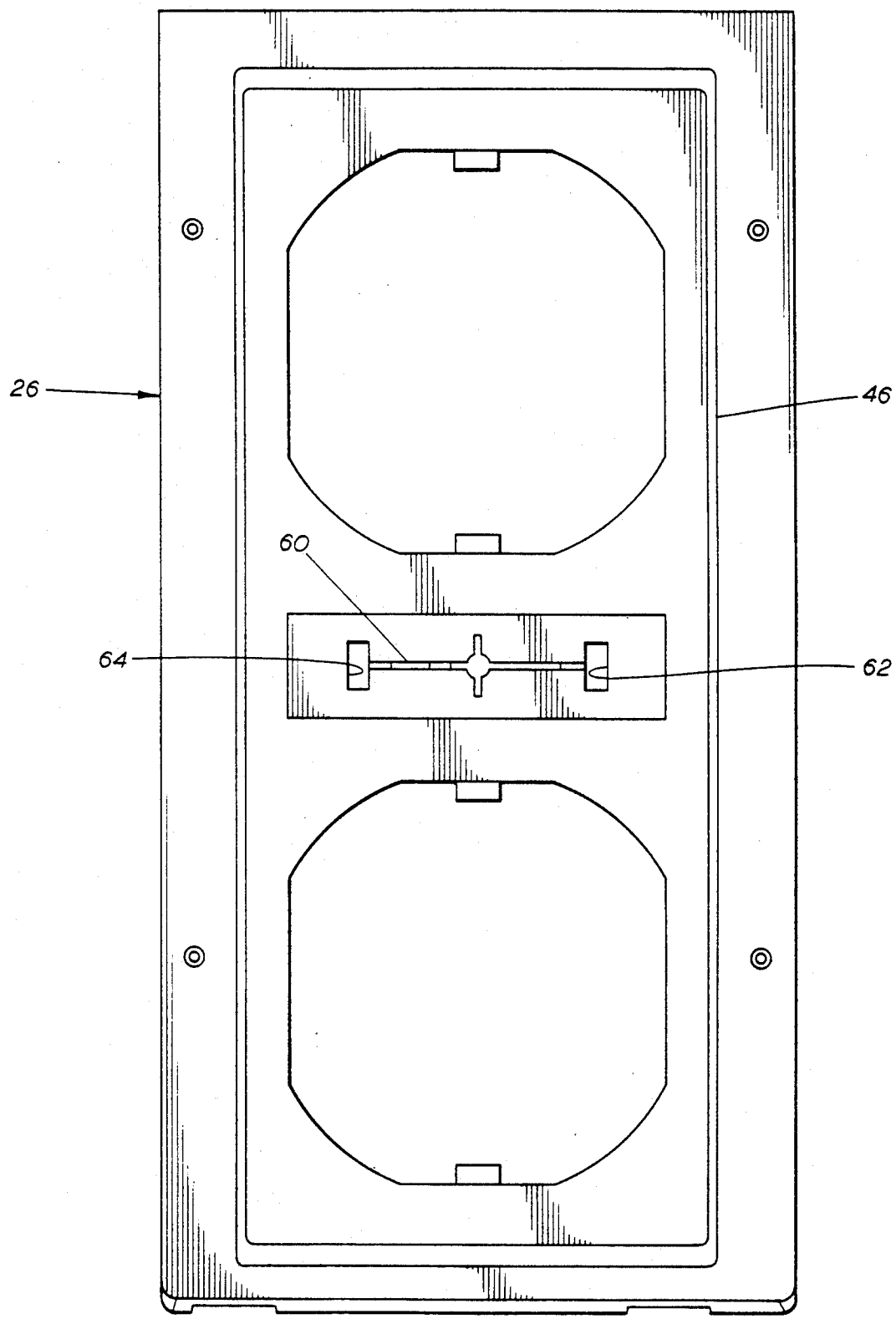
FIG. 5 is a rear view of the bezel of FIG. 4.

The lower rear bezel 26 is shown independently in a bottom view in FIG. 4. The module 46 which contains the fans 54 and 56 is shown. Projecting from this module 46 is a combined device guiding frame 60. The guiding frame 60 is used to help align the combined device 32 and to provide additional support to prevent the combined device 32 from being crushed or broken should the computer system unit C be forcefully asserted against a vertical surface. The guiding frame 60 preferably projects from the module 46 a distance slightly less than the desired clearance distance between the fans 54 and 56 and the vertical surface. The guiding frame 60 contains a notch or key way 66 used in conjunction with the guide 32. As shown in FIG. 5, the guiding frame 60 is preferably cross shaped to allow easier alignment of the combined device 32. The ends of the arms of the guiding frame 60 are preferably tapered to allow ease of installation of the combined device 32. As shown in FIG. 5, the module 46 preferably includes two openings 62 and 64 for receiving projecting locking elements of the combined device 32.

Figure 6:
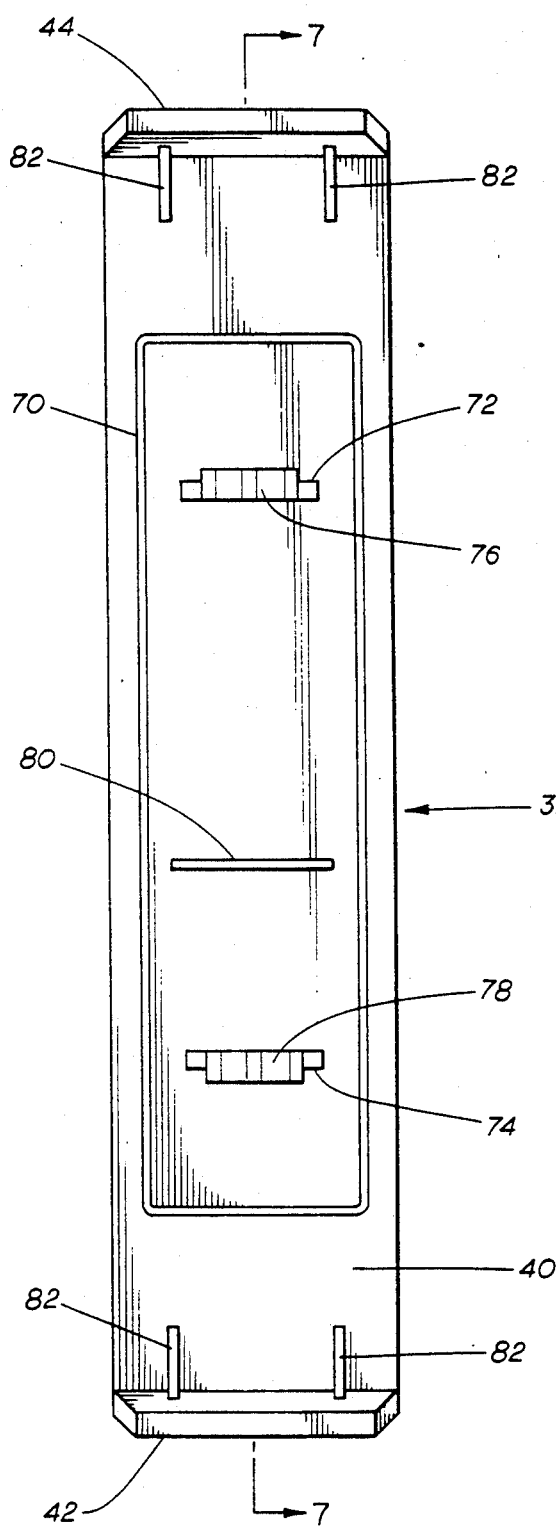
FIG. 6 is a plan view of the combined wire guide and fan clearance device according to the present invention.
Figure 7:
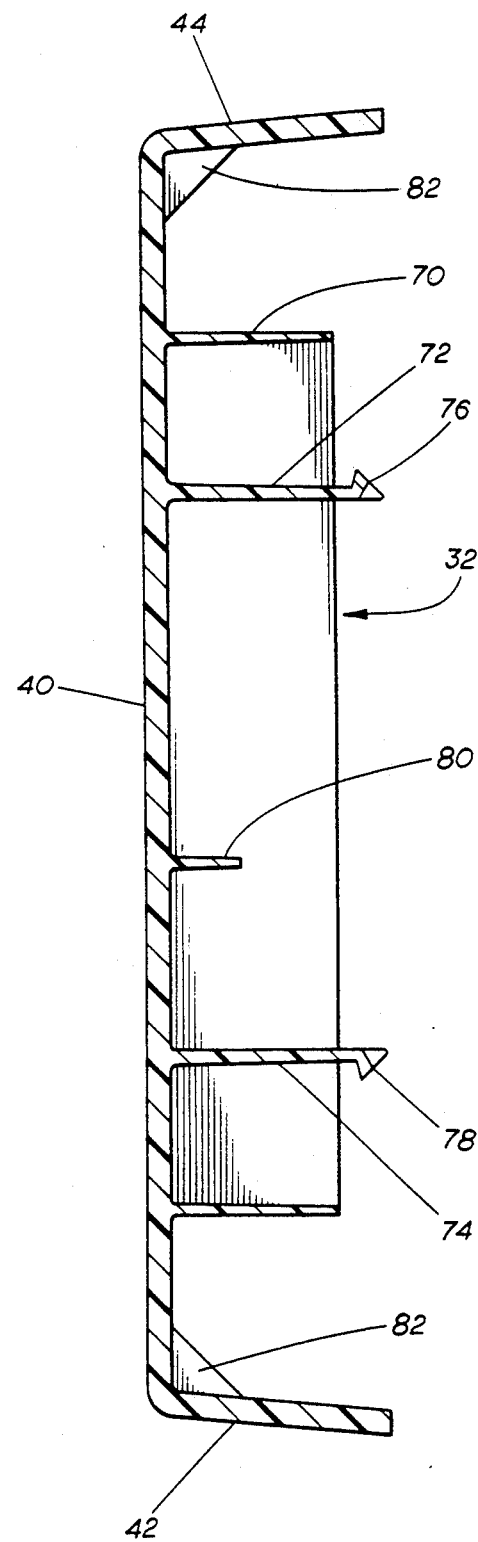
FIG. 7 is a view in cross-section taken along line 7—7 as indicated in FIG. 6.

A view of the combined device 32 in the removed position and from a view facing from the front of the computer unit C is shown in FIG. 6. The combined device 32 includes a flange 70 extending from the rear flat portion 40 such that when the thickness of the rear flat portion 40 is combined with the extension of the flange 70, the desired distance from the rear of the module 46 is developed. Contained inside the area enclosed by the flange 70 and extending generally perpendicular from the rear portion 40 are two locking tabs 72 and 74. The locking tabs 72 and 74 include tab portions 76 and 78 which are angled to provide easy insertion into the openings 62 and 64 and a locking action once fully inserted. Preferably the combined device 32 is formed of a plastic material so that the locking tabs 72 and 74 are sufficiently resilient to allow the locking tabs 72 and 74 to flex when being projected through the openings 62 and 64 and spring out when the tab portions 76 and 78 have entered the module 46. It is understood that other materials can be employed and that the combined device 32 could be comprised of multiple elements instead of a single molded piece as in the preferred embodiment described herein. Also extending perpendicularly from the rear portion 40 is a reference tab 80 designed to mate with the key way 66 of the guiding frame 60.

A plurality of stiffening braces 82 are provided between the rear portion 40 and the arms 42 and 44. The stiffening braces 82 are used to provide additional support to the arms 42 and 44 to prevent them from being easily broken from the rear portion 40.

In use, the combined device 32 is brought to the module 46 in an orientation such that the reference tab 80 is in alignment with the key way 66. The combined device 32 is then moved toward the module 46, with the slanted edges of the guiding frame 60 helping align the combined device 32 as it is moved toward the module 46. As the two pieces are brought together, the locking tabs 72 and 74 flex and enter the openings 62 and 64. As the combined device 32 is further moved toward the module 46, the tab portions 76 and 78 clear the module 46 and spring outwardly, thus providing a lock to prevent accidental removal of combined device 32. Travel of the combined device 32 toward the module 46 completes when flange 70 makes contact With the module 46. In this manner the combined device 32 is firmly attached to the module 46. The computer system unit C can then be placed in a desired location and sufficient rear fan clearances are provided due to the presence of the combined device 32. Additionally, wires can be conveniently routed in the cavities 50 and 52 provided between the arms 42 and 44 of the combined device 32 and the module 46.

The combined device 32 is removed by sliding the combined device 32 in a lateral or vertical direction until one of the tab portions 76 or 78 is wholly within a opening 62 or 64. The combined device 32 is then slightly rotated to remove that locking tab 72 or 74 from the module 46 and lateral or vertical motion in the opposite direction is developed to clear the other tab portion 76 or 78, at which time the combined device 32 is completely removed. In an alternate embodiment, the lateral motion of the installed combined device 32 is limited to less than that necessary to clear a tab portion 76 or 78 and then the lower rear bezel 26 must be removed and the locking tabs 72 or 74 flexed by applying force directly to the tab portions 76 or 78.

Having described the invention above, various modifications of the techniques, procedures, material and equipment will be apparent to those in the art. It is intended that all such variations within the scope and spirit of the appended claims be embraced thereby.

We claim:

1. A computer system unit comprising:
a cooling fan;
an enclosure for containing the components of the computer system, said enclosure including a bezel located at the rear of said enclosure and incorporating said cooling fan; and
means removably affixed to said rear bezel and extending from said rear bezel a distance sufficient to provide substantially unobstructed clearance between said cooling fan and any adjacent substantially vertical surface to allow adequate ventilation of the computer system.

2. The computer system unit of claim 1, wherein said extended means includes a portion generally parallel with the rear surface of said rear bezel.

3. The computer system unit of claim 2, wherein said extended means further includes a flange extending from said parallel portion contacting said rear bezel and said flange extending from said parallel portion an amount substantially equal to the clearance distance less the thickness of said parallel portion.

4. The computer system unit of claim 3, wherein said rear bezel includes guide means cooperating with said flange for centering said flange as said extending means is affixed to said rear bezel.

5. The computer system unit of claim 4, wherein said guide means includes a key way and wherein said extended means further includes a reference tab projecting from said parallel portion for mating with said key way.

6. The computer system of claim 2, wherein
said rear bezel includes openings and wherein said extended means further includes locking means extending from said parallel portion and spaced to enter said openings in said rear bezel when said extended means is affixed to said rear bezel.

7. The computer system unit of claim 6, wherein said locking means includes flexible tabs extending from said parallel portion, said flexible tabs including a tab portion having an angled face for contacting edges of said openings in said rear bezel during insertion through said openings and a parallel face for extending parallel to said rear bezel when beyond said openings for retaining said extended means.

8. A computer system unit comprising:
a cooling fan;
an enclosure for containing the components of the computer system, said enclosure including a bezel located at the rear of said enclosure and incorporating said cooling fan; and
means removably affixed to said rear bezel and extending from said rear bezel a distance sufficient to provide substantially unobstructed clearance between said cooling fan and any adjacent vertical surface to allow adequate ventilation of the computer system, said extended means includes a portion generally parallel with the rear surface of said bezel and arms located generally at the ends of said parallel portion and angled to project toward said rear bezel;
wherein said extended means further includes a flange extending from said parallel portion contacting said rear bezel, said flange width being less than the distance between said arms so that cavities are formed between said parallel portion, said flange, said arms and said rear bezel, and said flange extending from said parallel portion an amount substantially equal to the clearance distance less the thickness of said parallel portion.

9. The computer system unit of claim 8, wherein said rear bezel includes guide means cooperating with said flange for centering said flange as said extending means is affixed to said rear bezel.

10. The computer system unit of claim 9, wherein said guide means includes a key way and wherein said extended means further includes a reference tab projecting from said parallel portion for mating with said key way.

11. A computer system unit comprising:
a cooling fan;
an enclosure for containing the components of the computer system, said enclosure including a bezel located at the rear of said enclosure and incorporating said cooling fan; and
means removably affixed to said rear bezel and extending from said rear bezel a distance sufficient to provide substantially unobstructed clearance between said cooling fan and any adjacent vertical surface to allow adequate ventilation of the computer system, said extended means includes a portion generally parallel with the rear surface of said bezel and arms located generally at the ends of said parallel portion and angled to project toward said rear bezel;
wherein said rear bezel includes openings and wherein said extended means further includes locking means extending from said parallel portion and spaced to enter said openings in said rear bezel when said extended means is affixed to said rear bezel.

12. The computer system unit of claim 11, wherein said locking means includes flexible tabs extending from said parallel portion, said flexible tabs including a tab portion having an angled face for contacting edges of said openings in said rear bezel during insertion through said openings and a parallel face for extending parallel to said rear bezel when beyond said openings for retaining said extended means.

* * * * *